United States Patent
Frank et al.

(10) Patent No.: US 7,855,618 B2
(45) Date of Patent: Dec. 21, 2010

(54) BULK ACOUSTIC RESONATOR ELECTRICAL IMPEDANCE TRANSFORMERS

(75) Inventors: Michael L. Frank, Menlo Park, CA (US); Richard C. Ruby, Menlo Park, CA (US); Tiberiu Jamneala, San Francisco, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 36 days.

(21) Appl. No.: 12/112,633

(22) Filed: Apr. 30, 2008

(65) Prior Publication Data
US 2009/0273415 A1    Nov. 5, 2009

(51) Int. Cl.
*H03H 9/00* (2006.01)
*H03H 9/15* (2006.01)

(52) U.S. Cl. ...................... 333/187; 333/189
(58) Field of Classification Search ........... 333/187, 333/188, 189, 190, 191, 192
See application file for complete search history.

(56) References Cited

U.S. PATENT DOCUMENTS

| | | |
|---|---|---|
| 3,174,122 A | 3/1965 | Fowler, et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |

(Continued)

FOREIGN PATENT DOCUMENTS

DE    10160617    6/2003

(Continued)

OTHER PUBLICATIONS

Auld, B. A., "Acoustic Resonators", *Acoustic Fields and Waves in Solids*, Second Edition, vol. II 1990, 250-259.

(Continued)

*Primary Examiner*—Dean O Takaoka (57) ABSTRACT

An electrical impedance transformer comprises a first film bulk acoustic resonator (FBAR), having a first electrical impedance and a first resonance frequency. The electrical impedance transformer also comprises: a second FBAR, having a second electrical impedance and a second resonance frequency, and being disposed over the first FBAR. The electrical impedance transformer also includes a decoupling layer disposed between the first and the second FBARs. The first electrical impedance differs from the second electrical impedance and the first and second resonance frequencies are substantially the same.

12 Claims, 7 Drawing Sheets

U.S. PATENT DOCUMENTS

| | | |
|---|---|---|
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,150,703 A | 11/2000 | Cushman et al. |
| 6,187,513 B1 | 2/2001 | Katakura |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,448,695 B2 | 9/2002 | Milsom |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |

| | | |
|---|---|---|
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,842,089 B2 | 1/2005 | Lee |
| 6,853,534 B2 | 2/2005 | Williams |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 * | 6/2006 | Korden et al. ............... 333/189 |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,128,941 B2 | 10/2006 | Lee |
| 7,138,889 B2 | 11/2006 | Lakin |
| 7,161,448 B2 | 1/2007 | Feng et al. |
| 7,170,215 B2 | 1/2007 | Namba et al. |
| 7,173,504 B2 | 2/2007 | Larson, III et al. |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,259,498 B2 | 8/2007 | Nakatsuka et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Masako |
| 7,310,861 B2 | 12/2007 | Aigner et al. |
| 7,332,985 B2 | 2/2008 | Larson, III et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,388,318 B2 | 6/2008 | Yamada et al. |
| 7,388,454 B2 | 6/2008 | Ruby et al. |
| 7,388,455 B2 | 6/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,425,787 B2 | 9/2008 | Larson, III |
| 7,439,824 B2 | 10/2008 | Aigner |
| 7,545,532 B2 | 6/2009 | Muramoto |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley et al. |
| 2004/0195937 A1 | 10/2004 | Matsubara et al. |
| 2004/0212458 A1 | 10/2004 | Lee |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093653 A1 | 5/2005 | Larson, III |
| 2005/0093654 A1 | 5/2005 | Larson, III et al. |

| | | |
|---|---|---|
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206483 A1 | 9/2005 | Pashby et al. |
| 2005/0218488 A1 | 10/2005 | Mie |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson, III et al. |
| 2006/0290446 A1 | 12/2006 | Aigner et al. |
| 2007/0035364 A1* | 2/2007 | Sridhar et al. ............... 333/191 |
| 2007/0037311 A1 | 2/2007 | Izumi et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1* | 8/2007 | Jamneala et al. ............ 333/191 |
| 2007/0205850 A1 | 9/2007 | Jamneala et al. |
| 2007/0279153 A1 | 12/2007 | Ruby |
| 2007/0296521 A1* | 12/2007 | Schmidhammer .......... 333/133 |
| 2008/0055020 A1 | 3/2008 | Handtmann et al. |

FOREIGN PATENT DOCUMENTS

| | | |
|---|---|---|
| EP | 0637875 | 2/1995 |
| EP | 689254 | 12/1995 |
| EP | 0865157 | 9/1998 |
| EP | 973256 | 1/2000 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 61054686 | 3/1986 |
| JP | 06005944 | 1/1994 |
| JP | 2002/217676 | 8/2002 |
| JP | 2003/124779 | 4/2003 |
| WO | WO-98/16957 | 4/1998 |
| WO | WO-01/06647 | 1/2001 |
| WO | WO-02/103900 | 12/2002 |
| WO | WO-03/043188 | 5/2003 |
| WO | WO-03/050950 | 6/2003 |
| WO | WO-2003/058809 | 7/2003 |
| WO | WO-2004/034579 | 4/2004 |
| WO | WO-2004/051744 | 6/2004 |
| WO | WO-2005/043752 | 5/2005 |
| WO | WO-2005/043753 | 5/2005 |
| WO | WO-2006/018788 | 2/2006 |

OTHER PUBLICATIONS

Coombs, Clyde F., "Electronic Instrument Handbook", Second Edition, McGraw-Hill, Inc. 1995, pp. 5.1 to 5.29.

Hadimioglu, B. et al., ""Polymer Films As Acoustic Matching Layers".", *1990 IEEE Ultrasonics Symposium Proceedings*, vol. 3 pp. Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007 Dec. 1990 , 1337-1340.

Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002 , pp. 389-400.

Jung, Jun-Phil et al., "Experimental and Theoretical Investigation on the Relationship Between AlN Properties and AlN-Based FBAR Characteristics", *2003 IEEE International Frequency Control Symposium and PDA Exhibition Jointly with the 17th European Frequency and Time Forum* Sep. 3, 2003 , 779-784.

Krishnaswamy, S.V. et al., "Film Bulk Acoustic Wave Resonator Technology", May 29, 1990 , 529-536.

Lakin, K.M. , "Bulk Acoustic Wave Coupled Resonator Filters", *2002 IEEE International Frequency Control Symposium and PDA Exhibition* Jan. 2, 2002, 8-14.

Lakin, K.M. , "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications", *2001 IEEE Ultrasonics Symposium* Jan. 1, 2001 , 833-838.

Lobl, H.P. et al., "Piezoelectric Materials for BAW Resonators and Filters", *2001 IEEE Ultrasonics Symposium* Jan. 1, 2001 , 807-811.

Martin, Steven J. et al., "Development of a Low Dielectric Constant Polymer for the Fabrication of Integrated Circuit Interconnect", *12 Advanced Materials* Dec. 23, 2000 , 1769-1778.

Reinhardt, Alexandre et al., "Design of Coupled Resonator Filters Using Admittance and Scattering Matrices", *2003 IEEE Ultrasonics Symposium* May 3, 2003 , 1428-1431.

Tiersten, H. F. et al., "An Analysis of Thiskness-Extensional Trapped Energy Resonant Device Structures with Rectangular Electrodes in the Piezoelectric Thin Film on Silicon Configuration", *J. Appl. Phys.* 54 (10) Oct. 1983 , 5893-5910.

Yang, C.M. et al., "Highly C Axis Oriented AlN Film Using MOCVD for 5GHx Band FBAR Filter", *2003 IEEE Ultrasonics Symposium* Oct. 5, 2003 , pp. 170-173.

U.S. Appl. No. 10/971,169, filed Oct. 22, 2004, Larson III, John D., et al.

Al-Ahmad, M. et al., "Piezoelectric-Based Tunable Microstrip Shunt Resonator", *Proceedings of Asia-Pacific Microwave Conference 2006*.

Aoyama, Takayuki et al., "Diffusion of Boron, Phosphorous, Arsenic and Antimony in Thermally Grown SiliconDioxide", *Journal of the Electrochemical Society*, vol. 146, No. 5 1999 , 1879-1883.

Bauer, L. O. et al., "Properties of Silicon Implanted with Boron Ions through Thermal Silicon Dioxide", *Solid State Electronics*, vol. 16, No. 3 Mar. 1973 , 289-300.

Choi, Sungjin et al., "Design of Half-Bridge Piezo-Transformer Converters in the AC Adapter Applications", *IEEE 2005* , 244-248.

Fattinger, G. G. et al., "Coupled Bulk Acoustic Wave Resonator Filters: Key technology for single-to-balanced RF filters", 0/7803-8331-1/4/W20.00; *IEEE MTT-S Digest* 2004 , 927-929.

Hara, K. , "Surface Treatment of Quartz Oscillator Plate by Ion Implantation", *Oyo Buturi*, vol. 47, No. 2 Feb. 1978 , 145-146.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.

Jiang, Yimin et al., "A Novel Single-Phase Power Factor Correction Scheme", *IEEE* 1993, 287-292.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M., "Thin Film BAW Filters for Wide Bandwidth and High Performance Applications", *IEEE Microwave Symposium Digest*; vol. 2 Jun. 6-11, 2004, 923-926.

Lakin, K. M., "Thin Film Resonators and Filters", *IEEE Untrasonics Symposium*, Caesar's Tahoe, NV Oct. 1999, 895-906.

Lakin, et al., "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AIN FBAR Resonators", *IEEE Ultrasonics Symposium* 2002, 939-943.

Li, Yunxiu et al., "AC-DC Converter with Worldwide Range Input Voltage by Series and Parallel Piezoelectric Transformer Connection", *35th Annual IEEE Power Electronics Specialists Conference* 2004.

Navas, J. et al., "Miniaturised Battery Charger using Piezoelectric Transformers", *IEEE* 2001, 492-496.

Ng, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pang, W. et al., "High Q Single-Mode High-Tone Bulk Acoustic Resonator Integrated With Surface-Machined FBAR Filter", *Microwave Symposium Digest, IEEE MTT-S International* 2005, 413-416.

Parker, T. E. et al., "Temperature-Compensated Surface Acoustic-Wave Devices with SiO2 Film Overlays", *J. Appl. Physics*, vol. 50 1360-1369, Mar. 1979.

Ruby, R. C., "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Schuessler, Hans H., "Ceramic Filters and Resonators", Reprinted from *IEEE Trans. Sonics Ultrason.*, vol. SU-21 Oct. 1974, 257-268.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Topich, J.A. et al., "Effects of Ion Implanted Flourine in Silicon Dioxide", *Nuclear Instr. And Methods*, Cecon Rec, Cleveland, OH May 1978, 70-73.

Tsubbouchi, K. et al., "Zero Temperature coefficient Surface Acoustic Wave Devices using Epitaxial AIN Films", *IEEE Ultrasonic symposium*, San Diaego, CA, 1082 1982, 240-245.

Vasic, D et al., "A New Method to Design Piezoelectic Transformer Used in MOSFET & IGBT Drive Circuits", *IEEE 34th Anuual Power Electronics Specialists Conference*, 2003 vol. 1 Jun. 15-19, 2003, 307-312.

Vasic, D et al., "A New MOSFET & IGBT Gate Drive Insulated by a Piezoelectric Transformer", *IEEE 32 nd Annual Power Electronics Specialists Conference*, 2001 vol. 3 2001, 1479-1484.

Sanchez, A.M. et al., "Mixed Analytical and Numerical Design Method for Piezoelectric Transformers", *IEEE Xplore* 2003, 841-846.

\* cited by examiner

FIG. 4 freq (2.300GHz to 2.700GHz)

BULK ACOUSTIC RESONATOR ELECTRICAL IMPEDANCE TRANSFORMERS

BACKGROUND

In many applications, it is useful to provide an electrical impedance transformation from an input having one impedance to an output having another electrical impedance. For example, in many communication devices, an antenna is used to receive signal and to transmit signals. The received signals are provided to a receiving amplifier of a receiver of the communication device. Moreover, the antenna may receive signals from a transmitter amplifier of a transmitter. Regardless of whether the transmission/reception of signals is half or full duplex, or even simplex, often times the antenna has an impedance that varies from the impedance of the amplifier (receiver or transmitter). As should be appreciated, mismatched impedances result in reflections and losses that are beneficially avoided.

Among other technologies, electrical impedance transformers can be based on bulk acoustic waves (BAW) devices. One type of electrical impedance transformer is based on a film bulk acoustic resonator (FBAR) structure. The transformer includes two acoustic stacks, each comprising a layer of piezoelectric material disposed between two electrodes. A decoupling material is disposed between the acoustic stacks. Acoustic waves achieve resonance across the acoustic stacks, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns, and length and width dimensions of hundreds of microns, FBARs beneficially provide a comparatively compact alternative to known resonators. However, certain known BAW-based electrical impedance transformers suffer from, among other drawbacks, insertion loss and reduced bandwidth.

There is a need, therefore, for an electrical impedance transformer that overcomes at least the shortcoming of known electrical impedance transformers discussed above.

SUMMARY

In a representative embodiment, an electrical impedance transformer, comprises a first film bulk acoustic resonator (FBAR), having a first electrical impedance and a first resonance frequency. The first FBAR comprises: a first set of electrodes, having a first acoustic impedance; and a first piezoelectric layer having a first thickness. The first piezoelectric layer is disposed between the first set of electrodes. The electrical impedance transformer also comprises: a second FBAR, having a second electrical impedance and a second resonance frequency, and being disposed over the first FBAR. The second FBAR comprises: a second set of electrodes, having a second acoustic impedance, which differs from the first acoustic impedance; and a second piezoelectric layer having a second thickness. The second piezoelectric layer is disposed between the second set of electrodes. The electrical impedance transformer also includes a decoupling layer disposed between the first and the second FBARs. The first electrical impedance differs from the second electrical impedance and the first and second resonance frequencies are substantially the same.

In another representative embodiment, a communication device, comprising: a first port; a second port; and an electrical impedance transformer. The electrical impedance transformer comprises a first film bulk acoustic resonator (FBAR), having a first electrical impedance and a first resonance frequency. The first FBAR comprises: a first set of electrodes, having a first acoustic impedance; and a first piezoelectric layer having a first thickness. The first piezoelectric layer is disposed between the first set of electrodes. The electrical impedance transformer also comprises: a second FBAR, having a second electrical impedance and a second resonance frequency, and being disposed over the first FBAR. The second FBAR comprises: a second set of electrodes, having a second acoustic impedance, which differs from the first acoustic impedance; and a second piezoelectric layer having a second thickness. The second piezoelectric layer is disposed between the second set of electrodes. The electrical impedance transformer also includes a decoupling layer disposed between the first and the second FBARs. The first electrical impedance differs from the second electrical impedance and the first and second resonance frequencies are substantially the same.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

As used herein, the terms 'a' or 'an', as used herein are defined as one or more than one.

As used herein, the term "electric impedance" refers to a measure of the impediment to the flow of alternating current caused by a combination of resistance and reactance and typically is measured in ohms at a given frequency.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Representative embodiments are described in the context of FBAR-based electrical impedance transformers. It is noted that the term 'electrical impedance' may be referred to simply as 'impedance.' The term 'acoustic impedance' will always be referred to as such to avoid its being confused with the electrical impedance. As will become clearer as the present description continues, the electrical impedance transformers of the representative embodiments may comprise stacked FBARs of the representative having an acoustically decoupling layer between FBARs have certain features common to those described in commonly owned U.S. Pat. No. 7,019,605 to Larson, III and entitled "Stacked Bulk Acoustic Resonator Band-Pass Filter with Controllable Pass Bandwidth;" and certain features common to those described in commonly owned US Patent Publication 20070176710, to Jamneala, et al. The disclosures of this patent and patent publication are specifically incorporated herein by reference.

Figure 1:
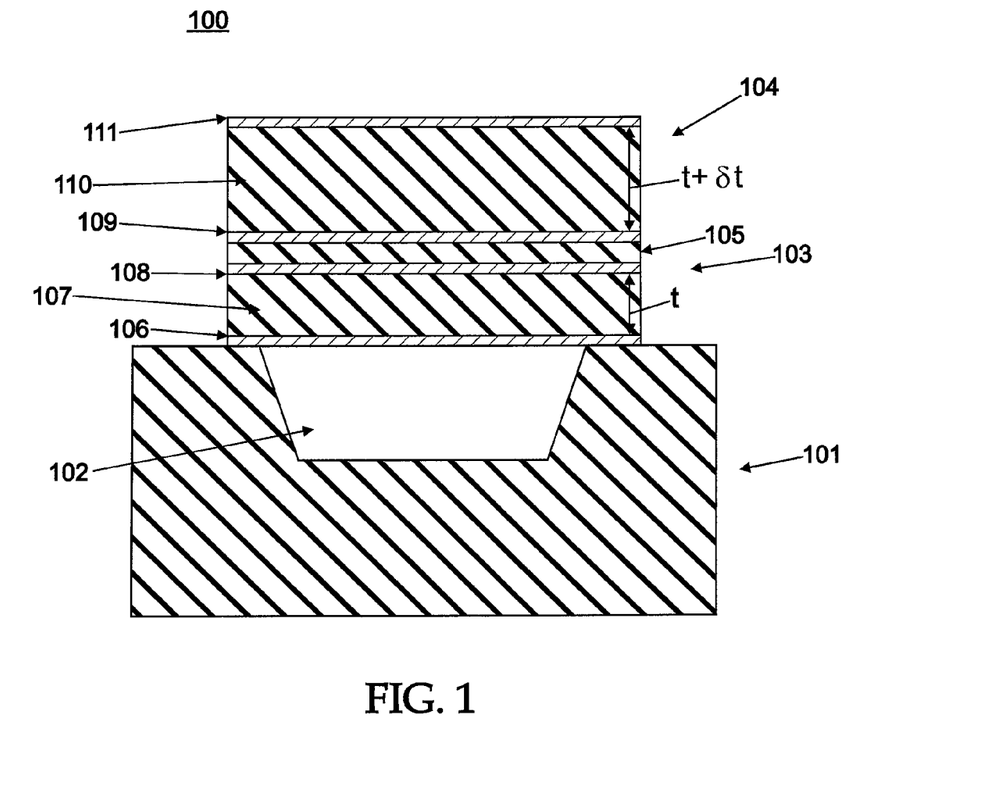
FIG. 1A is a cross-sectional view of an electrical impedance transformer in accordance with a representative embodiment.
FIG. 1B is a top view of the electrical impedance transformer of the representative embodiment of FIG. 1A.

FIG. 1A is a cross-sectional view of an electrical impedance transformer 100 in accordance with a representative embodiment. The impedance transformer 100 comprises a substrate 101 having a cavity 102 (or acoustic mirror) therein. A first FBAR stack resonator 103 is disposed over the cavity 102 of the substrate 101 resulting in an FBAR membrane. The impedance transformer 100 comprises a second FBAR resonator 104 disposed over the first FBAR resonator 103. An acoustic decoupler 105 is disposed between the first and second FBARs as shown. In representative embodiments, decoupler 105 comprises dielectric polymer SiLK® commercially provided by E.I. Dupont, Inc., USA. In other embodiments, the acoustic decoupler 105 is formed of a stack of layers alternately formed of high and low acoustic impedance materials and having respective thicknesses of approximately one-quarter of the wavelength corresponding to the target resonant frequency of the balun. It is emphasized that other materials and arrangements for layer 105 are contemplated. Some illustrative materials may be found in the incorporated references to Larson III, et al., and Jamneala, et al.

The cavity or reflector (e.g., a mismatched acoustic Bragg reflector) 102 and its fabrication may be as described in commonly owned U.S. Pat. No. 6,107,721, to Lakin, the disclosure of which is specifically incorporated into this disclosure by reference in its entirety. Moreover, the cavity 102 may be fabricated according to known semiconductor processing methods and using known materials. Illustratively, the cavity 102 may be fabricated according to the teachings of U.S. Pat. Nos. 5,587,620, 5,873,153 and 6,507,983 to Ruby, et al. The disclosures of these patents are specifically incorporated herein by reference. It is emphasized that the methods described in these patents are representative and other methods of fabrication and materials within the purview of one of ordinary skill in the art are contemplated.

The first FBAR resonator 103 comprises a first set of electrodes 106, 108, and a first piezoelectric layer 107 therebetween. In a representative embodiment, the first piezoelectric layer 107 comprises aluminum nitride (AlN) although other materials within the purview of one of ordinary skill in the art may be used in place of or in addition to AlN. As described more fully herein, the electrodes 106,108 are selected based on the desired impedance of the first FBAR resonator.

The second FBAR resonator 104 comprises a second set of electrodes 109, 111, and a second piezoelectric layer 110 therebetween. In a representative embodiment, the second piezoelectric layer 110 comprises aluminum nitride (AlN) although other materials within the purview of one of ordinary skill in the art may be used in place of or in addition to AlN. As described more fully herein, the electrodes 109, 111 are selected based on the desired impedance of the second FBAR resonator 104.

In a representative embodiment, the first piezoelectric layer 107 has a first thickness (t) and the second piezoelectric layer 110 has a second thickness (t+∂t), which is greater that 't.' The thicknesses of the layers 107, 110 are selected to provide a different electrical impedance for the first and second FBAR resonators. In particular, the capacitance of the FBAR is inversely proportional to the thickness of the piezoelectric layer between the electrodes if the areas are equal. In turn, the electrical impedance is inversely proportional to the capacitance; and as such the electrical impedance is proportional to the thickness of the piezoelectric layer of the FBAR resonator. In representative embodiments, the ratio of the impedances (relative value) of the first and second FBAR resonators 103, 104 is set by selecting the ratio of the thicknesses t and t+∂t. For example, in the exemplary embodiment shown in FIG. 1A, the thickness t of the first FBAR resonator 103 is smaller than the thickness (t+∂t) of the second FBAR resonator 104. In this way, the electrical impedance of the second FBAR resonator 104 is larger than the electrical impedance of the first FBAR 103. As will be described more fully herein, the absolute value of the electrical impedances of the first and second FBAR resonators 103, 104 are set by selecting the areal dimensions of the FBAR resonators. In representative embodiments, the areas of the two FBARs are substantially equal and are substantially overlapping.

As will be appreciated, a change in the thickness of the piezoelectric material will result in a change in the resonant frequency ($f_o$) of the FBAR resonator. However, the resonant frequency of the two FBAR resonators 103,104 of the electrical impedance transformer 100 must be substantially the same. (By substantially the same, the resonant frequencies are the same within some acceptable tolerance). One way to maintain the same the same resonant frequencies in the first and second FBARs 103,104, the overall acoustic thicknesses of the first and second FBARs 103, 104 are made substantially the same by increasing the thickness of the first set of electrodes 106, 108. However, while providing the desired resonant frequency, the electromechanical coupling coefficient, $k_r^2$, which is proportional to the ratio of the electric energy density in a particular volume to the acoustic energy in a particular volume, can be comparatively degraded by providing relatively thick electrodes. As should be appreciated, degradation of $k_r^2$ results in an undesirable reduction in insertion loss and decrease in bandwidth.

In accordance with representative embodiment of FIG. 1A, the resonant frequency of the first and second FBARs 103, 104 is set to substantially the same value, while the coupling coefficient, $k_r^2$, is substantially unchanged in the FBAR having decreased electrical impedance by selecting a material for the first set of electrodes 106, 108 that has a greater acoustic impedance (and is more mechanically rigid (i.e., 'stiffer')) than the material selected for the second set of electrodes 109, 111. Stated differently, the piezoelectric layer having a comparatively reduced thickness has a set of electrodes of a material that has a greater acoustic impedance. As should be appreciated, because the material having a greater acoustic impedance is used for the first set of electrodes 106, 108, their thickness can be comparatively reduced, and thus the desired resonant frequency can be attained. Moreover, because the overall thickness of the electrodes 106, 108 is also comparatively reduced, the deleterious impact of thicker electrodes on the coupling coefficient, $k_t^2$, can also be substantially avoided.

In a representative embodiment, the first set of electrodes 106, 108 are made of or comprise tungsten (W) or an alloy thereof, whereas the second set of electrodes 109, 111 are made of or comprise molybdenum (Mo). With these selected materials the lower impedance first FBAR 103 is provided with substantially the same resonant frequency and coupling coefficient, $k_t^2$, as the second FBAR 104. By way of comparison, for transformers working at a frequency of about 2 GHz and achieving a 2:1 impedance transformation ratio, the thickness of the piezoelectric layers 107 is approximately 1.0 μm, the thicknesses of electrodes (illustratively Tungsten) 106, 108 are about 2500 Angstroms, the thickness of piezoelectric layer 110 is approximately 2 μm and the thickness of the electrodes (illustratively molybdenum) 109, 111 are approximately 2000 Å.

The selection of the thicknesses, t and t+∂t, of the piezoelectric layers 107 and 110 determine the ratio of the impedances of the first FBAR 103 and the second FBAR 104 for a desired resonant frequency and coupling coefficient. For instance, the thicknesses of the various materials of the FBARs may be selected to provide a 2:1 impedance ratio, where the second FBAR 104, having a comparatively thick piezoelectric material, has twice the electrical impedance of the first FBAR 103. Selection of the absolute impedance (e.g., 50Ω to 100Ω transformation) is determined by the suitable selection of the areal dimension of the overlapping stacked FBARs.

Figure 1B:
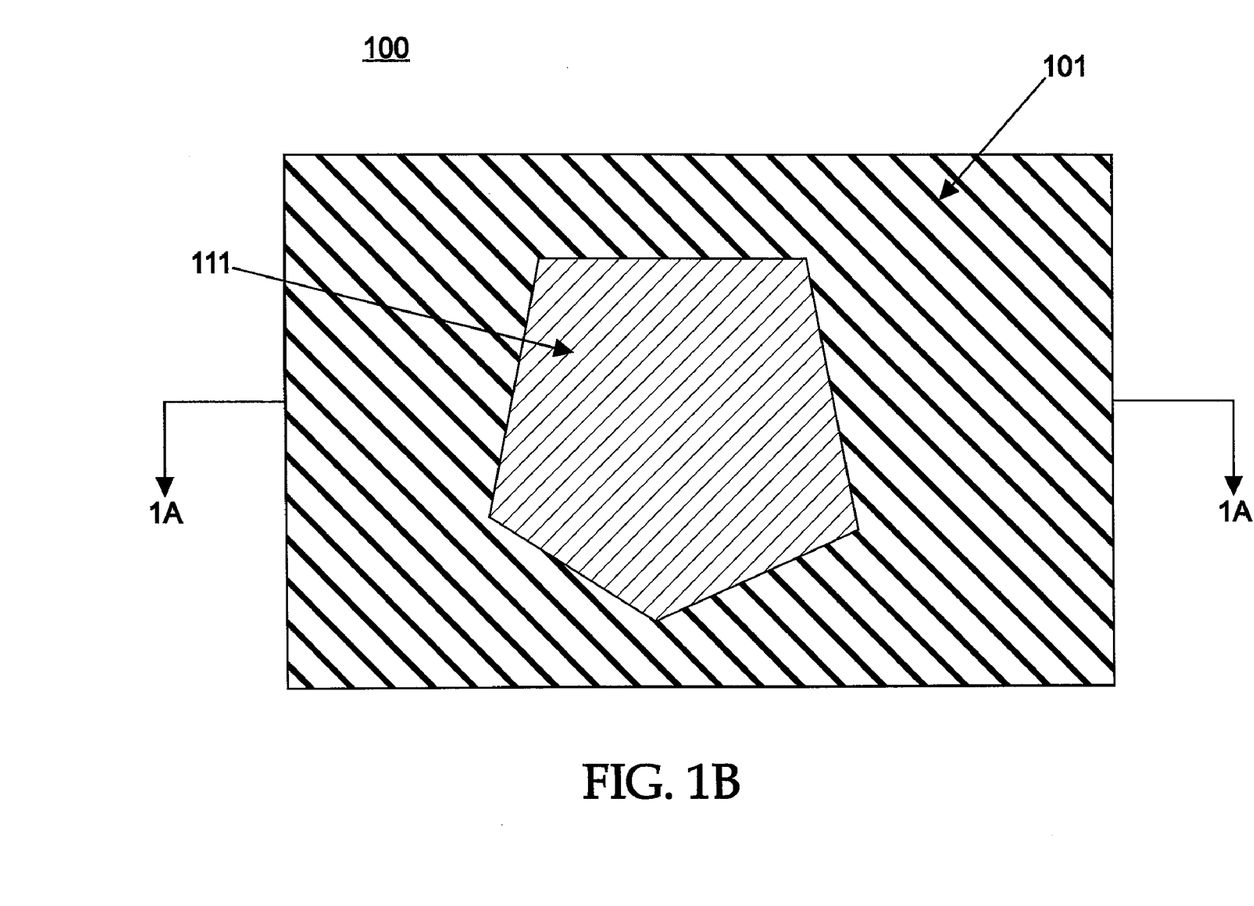

FIG. 1B is a top view of the electrical impedance transformer 100. The electrodes 111, 109, 108 and 106 may be selectively apodized and may include mass loading layers and other performance enhancing features. The use of apodization and mass loading are known to those of ordinary skill in the art and details thereof are generally omitted in order to avoid obscuring the description of the representative embodiments. For example, details of apodization may be found in U.S. Pat. No. 7,629,865, entitled "Piezoelectric Resonator Structures and Electrical Filters" to Richard C. Ruby, et al. In addition, details of mass loading may be found in U.S. Pat. No. 7,280,007, entitled "Thin Film Bulk Acoustic Resonator with Mass Loaded Perimeter" to Hongjun Feng, et al.; and U.S. patent application Ser. No. 11/713,726, entitled "Piezoelectric Resonator Structures and Electrical Filters having Frame Elements" to Jamneala, et al. Furthermore, the FBARs 103, 104 may include frame structures such as described in U.S. Pat. No. 7,714,684, entitled "Acoustic Resonator Performance Enhancement Using Alternating Frame Structure" to Richard C. Ruby, et al.

As should be appreciated, the first and second FBARs 103, 104 comprise a coupled resonator structure. As such, only the area of overlap function as coupled acoustic resonators. Therefore, the shapes and dimensions of the electrodes 111, 109, 108 and 106, and intervening piezoelectric layers 107, 110, are selected to substantially the same (i.e., to within manufacturing tolerances). Moreover, the electrodes and piezoelectric layers are aligned to substantially overlap (again to within manufacturing tolerances), thereby substantially optimizing the overlap of the FBARS 103,104.

The area of the first and second FBARs 103, 104 is determined by the area of the electrodes 111, 109, 108 and 106, and intervening piezoelectric layers 107, 110. Moreover, the absolute impedances of the first and second FBARs 103, 104 are determined by the areal dimensions of the first and second FBARs 103, 104. Thus, the selection of the areal dimensions of the electrodes 111, 109, 108 and 106, and intervening piezoelectric layers 107, 110 is used to select the absolute impedances of the first and second FBARs 103, 104.

In practice, once the thicknesses of the piezoelectric layers 107,110 are determined for the desired ratio of the impedance of the first FBAR 103 to the impedance of the second FBAR 104, the layers of the stacked FBAR structure are formed by known processing methods, such as described in one or more of the incorporated references above. To provide the absolute impedance of the first FBAR 103 and of the second FBAR 104, the electrodes 111, 109, 108 and 106 and piezoelectric layers 107, 110 are fabricated with the required areal dimensions to effect the desired impedances.

Continuing with the previous illustrative ratio, the thickness of the piezoelectric layers 107, 110 are selected to provide a 2:1 impedance ratio of the second FBAR 104 to the first FBAR 103; and the electrodes 111, 109, 108 and 106, and piezoelectric layers 107, 110 are sized so that the areal dimensions provide a second FBAR 104 of 100Ω and a first FBAR 103 of 50Ω. Of course, the areal dimensions could provide other impedances; for instance the second FBAR 104 could be 200Ω and the first FBAR 103 could 100Ω by selection of the areal dimension. Alternatively, the ratio could be changed to another value and the areal dimension selected to suit a particular need.

Figure 2:
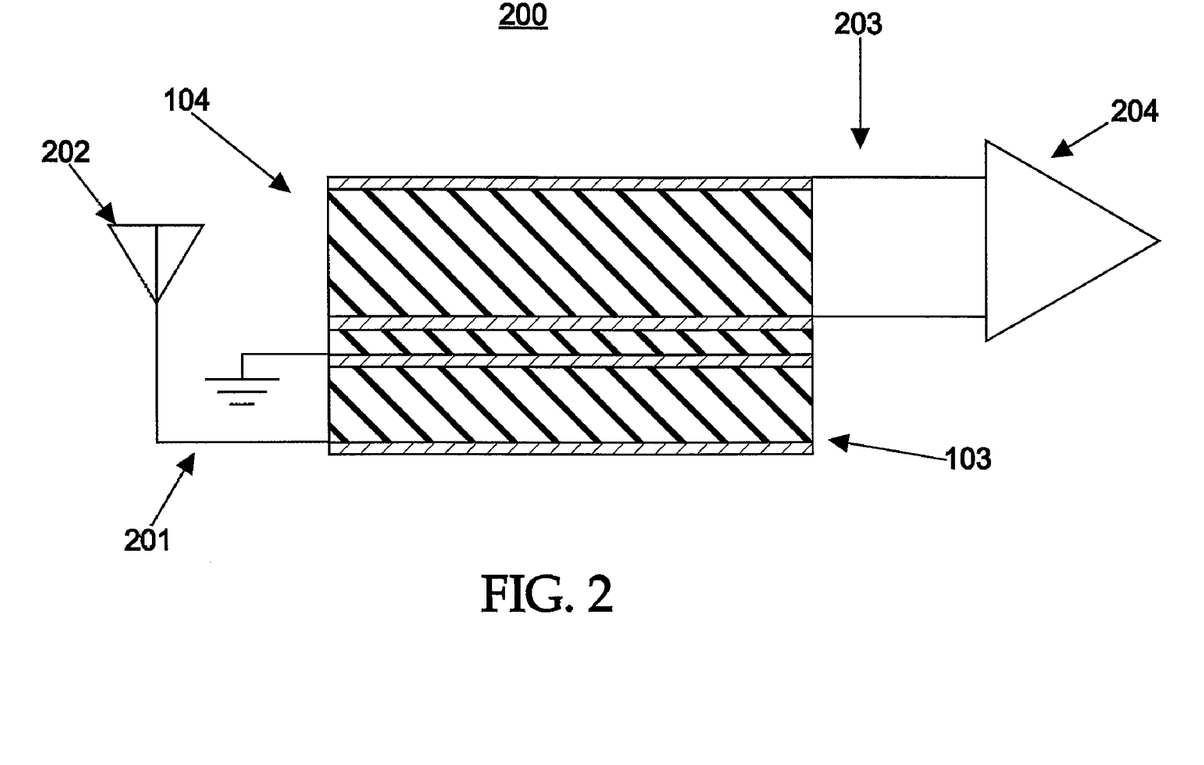
FIG. 2 is a simplified schematic view of a portion of a communication device including an electrical impedance transformer in accordance with a representative embodiment.

FIG. 2 is a simplified schematic view of a portion of a communication device 200 including an electrical impedance transformer in accordance with a representative embodiment. By 'portion' is meant only the elements germane to the present discussion are shown. Naturally, a communication device (e.g., a mobile phone) includes a large number of components, which while necessary to its function, need not be described in order to properly describe the function of the transformer 100 within the device 200. Thus, these components are not described to avoid obscuring the description of the illustrative embodiments.

The device 200 includes the electrical impedance transformer 100 including the first and second FBARs 103, 104. The substrate 101 is not illustrated for simplicity. Notably, many details of the transformer 100 described in conjunction with FIGS. 1A and 1B are common to the device 200 and are not repeated. An input 201 is connected to an antenna 202. The input 201 is connected to the first FBAR 103 having a first electrical impedance. An electrical signal from the input 201 is converted to an acoustic signal and is coupled to the second FBAR 104 having a second electrical impedance. The second FBAR 104 converts the acoustic signal to an electrical signal and provides the electrical signal to an output 203. In the representative embodiment, the output is connected to a receiver amplifier 204, which amplifies the signal for further processing at a receiver (not shown in FIG. 2.) Continuing with the previous example, with the thicknesses and areal dimensions selected, a signal from a 50Ω input 201 is provided to a 100Ω output 203 by the transformer 100 of an illustrative embodiment.

Figure 3:
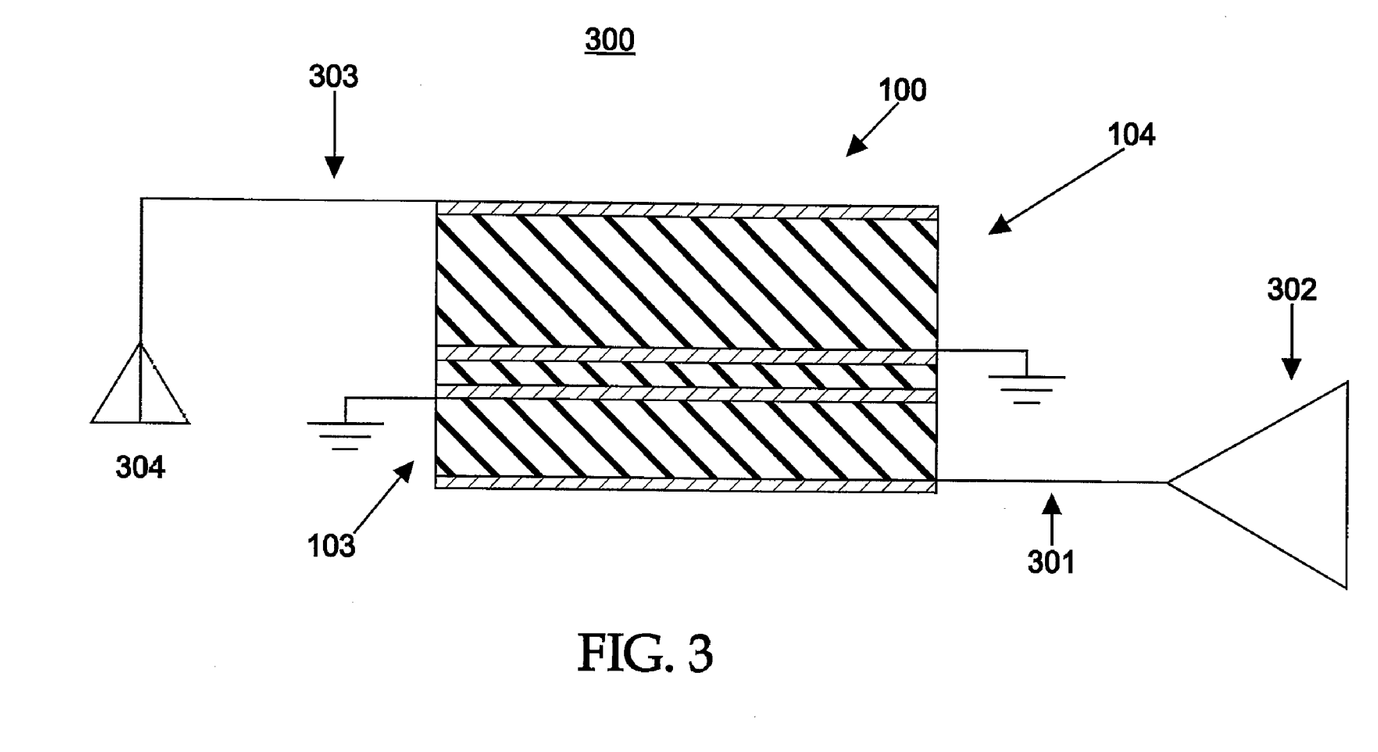
FIG. 3 is a simplified schematic view of a portion of a communication device including an electrical impedance transformer in accordance with a representative embodiment.

FIG. 3 is a simplified schematic view of a portion of a communication device 300 including an electrical impedance transformer in accordance with a representative embodiment. Again, by 'portion' is meant only the elements germane to the present discussion are shown. Naturally, a communication device (e.g., a mobile phone) includes a large number of components, which while necessary to its function, need not be described in order to properly describe the function of the transformer 100 within the device 300. Thus, these components are not described to avoid obscuring the description of the illustrative embodiments.

The device 300 includes the electrical impedance transformer 100 including the first and second FBARs 103, 104.

The substrate 101 is not illustrated for simplicity. Notably, many details of the transformer 100 described in conjunction with FIGS. 1A and 1B are common to the device 300 and are not repeated. An input 301 is connected to a transmit amplifier 302. The input 301 is connected to the first FBAR 103 having a first electrical impedance. An electrical signal from the input 301 is converted to an acoustic signal and is coupled to the second FBAR 104 having a second electrical impedance. The second FBAR 104 converts the acoustic signal to an electrical signal and provides the electrical signal to an output 303. In the representative embodiment, the output 303 is connected to an antenna 304, which transmits the signal to a receiver (not shown in FIG. 3.) Continuing with the previous example, with the thicknesses and areal dimensions selected, a signal from a 50Ω input 301 is provided to a 100Ω output 303 by the transformer 100 of an illustrative embodiment.

Applicants note that the device 200, 300 are merely illustrative and not intended to limit the scope of the present teachings. Notably, variations of the transformer 100 and connections thereto are contemplated. For instance, the transformation of input to output can be different than the step-up described. As such, the inputs 201, 301 could be at a higher impedance (e.g., 100Ω) and the outputs 203, 303 could be at a lower impedance (e.g., 50Ω). Furthermore, the electrical transformer 100 could be used in a wide variety of applications, and thus is not limited to the communications applications described. Generally, the electrical transformer 100 may be used in many types of electronic device to perform such functions as transforming impedances, linking single-ended circuitry with balanced circuitry or vice versa and providing electrical isolation.

Figure 4:
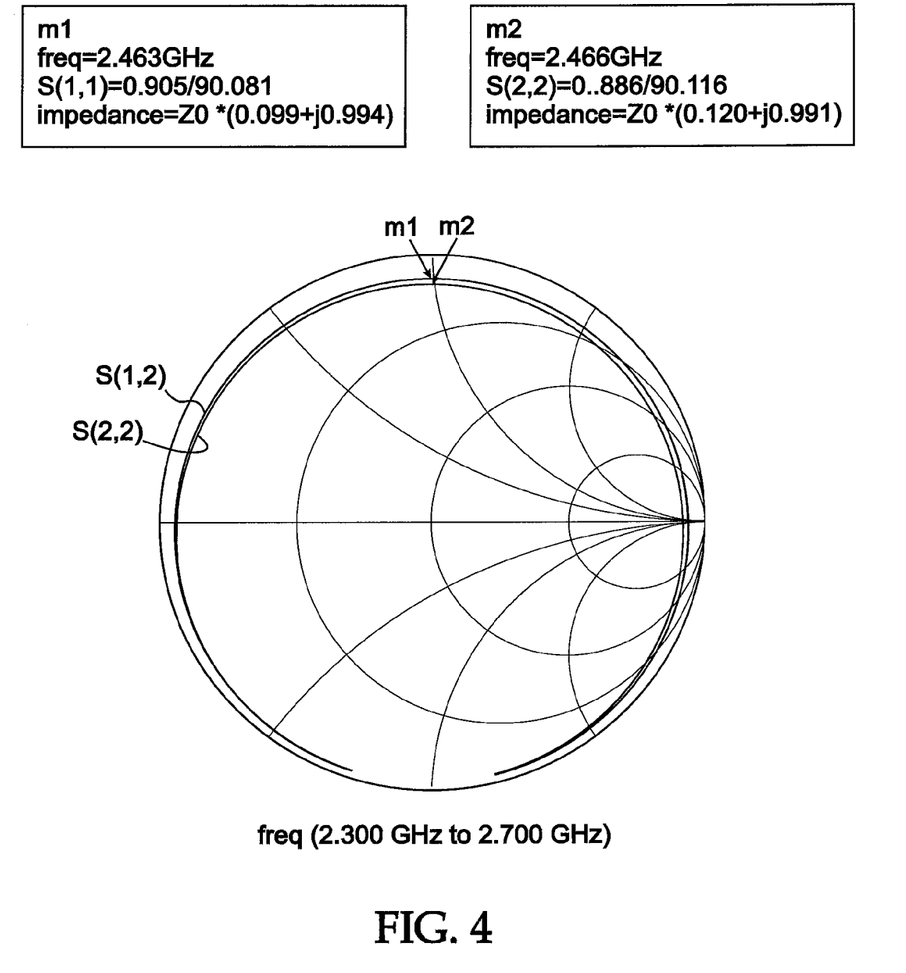
FIG. 4 is a graphical representation of a Q-circle (S11 and S22 parameters) of two FBARs in accordance with a representative embodiment.

FIG. 4 is a graphical representation of a Q-circle (S11 and S22 parameters) of two FBARs forming the acoustic transformer in accordance with a representative embodiment. The two FBARs have substantially the same resonant frequency, but the electrodes of one of the FBARs comprise a material with a comparatively higher acoustic impedance (e.g., W), while the electrodes of the other FBAR have a comparatively lower acoustic impedance (e.g., Mo). Due to the enhanced coupling coefficient provided by the electrodes having a higher acoustic impedance, the thickness of the piezoelectric layer (in this case AlN) is reduced with no significant variation in coupling coefficient, $k_t^2$, or resonant frequency, $f_0$.

Figure 5A:
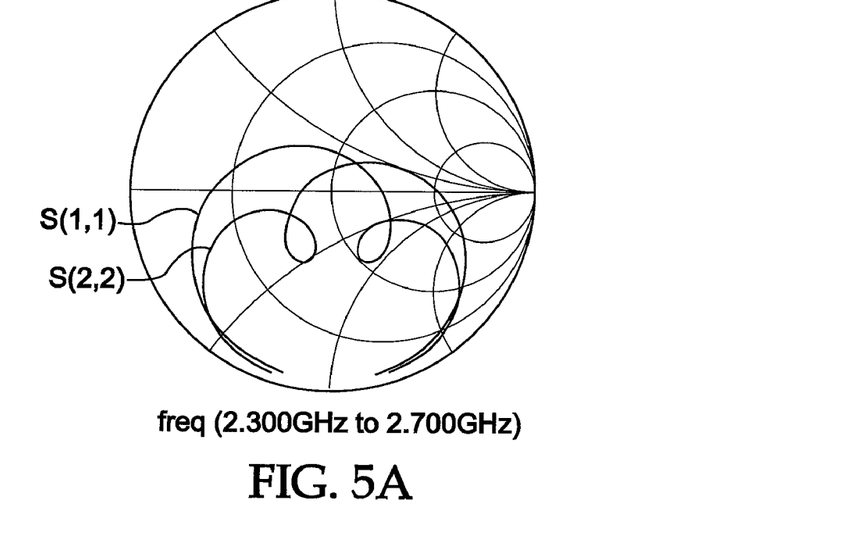
FIG. 5A is a graphical representation of a Q-circle (S11 and S22) of an electrical impedance transformer of a representative embodiment.

FIG. 5A is a graphical representation of a Q-circle (S11 and S22) of an electrical impedance transformer of a representative embodiment. The FBARs are arranged in a stacked (DS-BAR) configuration with approximately 1300 Angstroms of SiLK used as the acoustic decoupler. The resultant return loss plots for input, S11, and the output, S22, where the source impedances are 32 Ohms and 50 Ohm respectively.

Figure 5B:
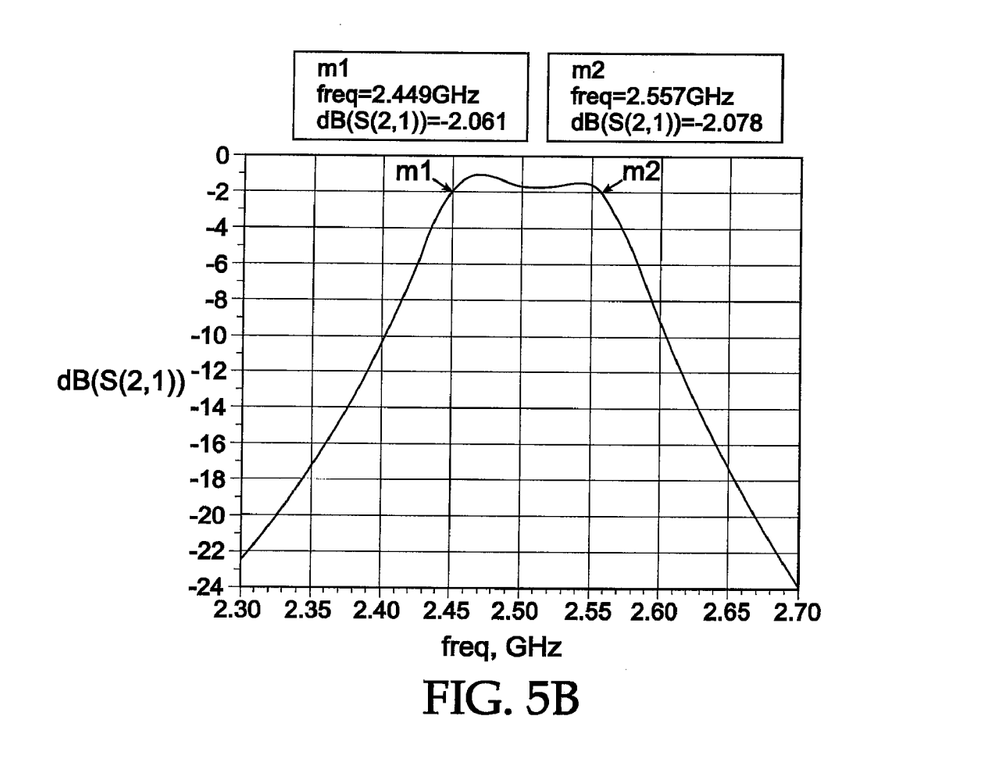
FIG. 5B is a graphical representation of the transmission coefficient S12 versus frequency in accordance with an electrical impedance transformer of a representative embodiment.

FIG. 5B is a graphical representation of the transmission coefficient (S12) versus frequency of the electrical impedance transformer described in connection with FIG. 5A. In the representative embodiment, the 2 dB bandwidth of 108 MHz BW is achieved.

Figure 6:
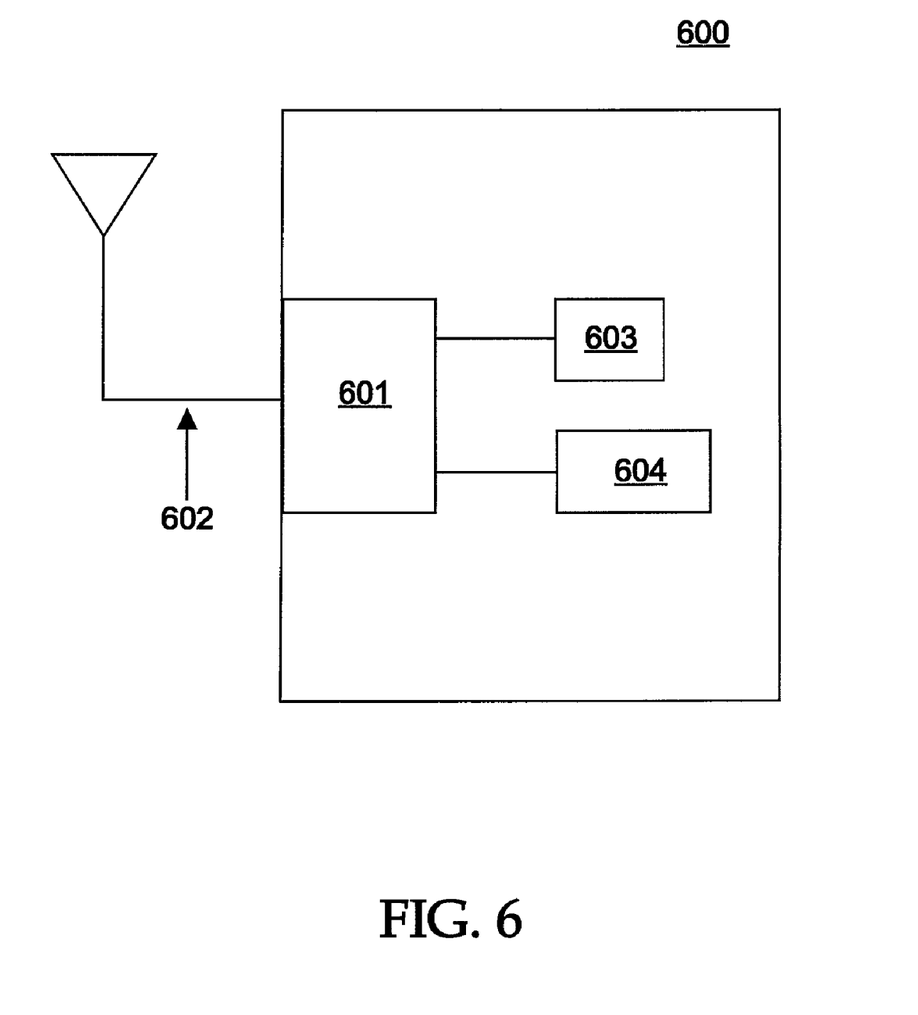
FIG. 6 is a simplified schematic view of a communications device in accordance with a representative embodiment.

FIG. 6 is a simplified schematic view of a communications device 600 in accordance with a representative embodiment. The communications device 600 includes an electrical impedance transformer 601, which is substantially identical to one of the impedance transformers described previously. The communications device includes an input/output 602 to an antenna; a transmitter 603 and a receiver 604. The device 600 may function in half or full duplex mode; and the impedance transformer 601 may provide a step-up or a step-down electrical impedance transformation. Moreover, the device may include more that one electrical impedance transformer 601; and may be configured in a different manner than shown.

In view of this disclosure it is noted that the various acoustic resonator filters described herein can be implemented in a variety of materials and variant structures. Moreover, applications other than resonator filters may benefit from the present teachings. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. An electrical impedance transformer, comprising:
  a first film bulk acoustic resonator (FBAR), having a first electrical impedance and a first resonance frequency comprising: a first set of electrodes, having a first acoustic impedance, the first set of electrodes comprising a first material; and a first piezoelectric layer having a first thickness, wherein the first piezoelectric layer is disposed between the first set of electrodes;
  a second FBAR, having a second electrical impedance and a second resonance frequency, and being disposed over the first FBAR, the second FBAR comprising: a second set of electrodes, having a second acoustic impedance, which differs from the first acoustic impedance, the second set of electrodes comprising a second material; and a second piezoelectric layer having a second thickness, wherein the second piezoelectric layer is disposed between the second set of electrodes, wherein the first thickness is less than the second thickness, and the first material is different than the second material; and
  a decoupling layer disposed between the first and the second FBARs, wherein the first electrical impedance differs from the second electrical impedance and the first and second resonance frequencies are substantially the same.

2. An electrical impedance transformer as claimed in claim 1, wherein the first set of electrodes comprise tungsten (W).

3. An electrical impedance transformer as claimed in claim 1, wherein the second set of electrodes comprise tungsten (W).

4. A communication device, comprising:
  a first port;
  a second port; and
  an electrical impedance transformer between the first port and the second port, the transformer comprising:
  a first film bulk acoustic resonator (FBAR), having a first electrical impedance and a first resonance frequency comprising: a first set of electrodes, having a first acoustic impedance, the first set of electrodes comprising a first material; and a first piezoelectric layer having a first thickness, wherein the first piezoelectric layer is disposed between the first set of electrodes;
  a second FBAR, having a second electrical impedance and a second resonance frequency, and being disposed over the first FBAR, the second FBAR comprising: a second set of electrodes, having a second acoustic impedance, which differs from the first acoustic impedance, the second set of electrodes comprising a second material; and a second piezoelectric layer having a second thickness, wherein the second piezoelectric layer is disposed between the second set of electrodes; and
  a decoupling layer disposed between the first and the second FBARs, wherein the first electrical impedance differs from the second electrical impedance and the first and second resonance frequencies are substantially the same, wherein the first thickness is less than the second thickness, and the first material is different than the second material.

5. An electrical impedance transformer as claimed in claim 4, wherein the first set of electrodes comprise tungsten (W).

6. An electrical impedance transformer as claimed in claim 4, wherein the second set of electrodes comprise tungsten (W).

7. A communication device as claimed in claim 4, wherein the first port is an input and comprises an antenna.

8. A communication device as claimed in claim 4, wherein the second port is an output and is connected to an amplifier.

9. A communication device as claimed in claim 4, wherein the first port is an output and comprises an antenna.

10. A communication device as claimed in claim 4, wherein the second port is an input and is connected to an amplifier.

11. An electrical impedance transformer, comprising:
a first film bulk acoustic resonator (FBAR), having a first electrical impedance and a first resonance frequency comprising: a first set of electrodes, having a first acoustic impedance, the first set electrodes comprising a first material; and a first piezoelectric layer having a first thickness, wherein the first piezoelectric layer is disposed between the first set of electrodes;
a second FBAR, having a second electrical impedance and a second resonance frequency, and being disposed over the first FBAR, the second FBAR comprising: a second set of electrodes, having a second acoustic impedance, which differs from the first acoustic impedance, the second set electrodes comprising a second material; and a second piezoelectric layer having a second thickness, wherein the second piezoelectric layer is disposed between the second set of electrodes, wherein the second thickness is less than the first thickness, and the first material is different than the second material; and
a decoupling layer disposed between the first and the second FBARs, wherein the first electrical impedance differs from the second electrical impedance and the first and second resonance frequencies are substantially the same.

12. A communication device, comprising:
a first port;
a second port; and
an electrical impedance transformer between the first port and the second port, the transformer comprising:
a first film bulk acoustic resonator (FBAR), having a first electrical impedance and a first resonance frequency comprising: a first set of electrodes, having a first acoustic impedance, the first set of electrodes comprising a first material; and a first piezoelectric layer having a first thickness, wherein the first piezoelectric layer is disposed between the first set of electrodes;
a second FBAR, having a second electrical impedance and a second resonance frequency, and being disposed over the first FBAR, the second FBAR comprising: a second set of electrodes, having a second acoustic impedance, which differs from the first acoustic impedance, the second set of electrodes comprising a second material; and a second piezoelectric layer having a second thickness, wherein the second piezoelectric layer is disposed between the second set of electrodes; and
a decoupling layer disposed between the first and the second FBARs, wherein the first electrical impedance differs from the second electrical impedance and the first and second resonance frequencies are substantially the same, wherein the second thickness is less than the first thickness, and the first material is different than the second material.

* * * * *